United States Patent
Jodo et al.

(10) Patent No.: US 11,901,658 B2
(45) Date of Patent: Feb. 13, 2024

(54) ELECTRIC CONNECTOR SET AND MOUNTING STRUCTURE OF ELECTRIC CONNECTOR SET

(71) Applicant: Murata Manufacturing Co., Ltd., Kyoto-fu (JP)

(72) Inventors: Takahiro Jodo, Nagaokakyo (JP); Minoru Mamuro, Nagaokakyo (JP); Hiroyuki Hoshiba, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 324 days.

(21) Appl. No.: 17/337,861

(22) Filed: Jun. 3, 2021

(65) Prior Publication Data
US 2021/0296806 A1 Sep. 23, 2021

Related U.S. Application Data

(63) Continuation of application No. PCT/JP2019/045239, filed on Nov. 19, 2019.

(30) Foreign Application Priority Data

Dec. 4, 2018 (JP) ................. 2018-227456

(51) Int. Cl.
*H01R 12/71* (2011.01)
*H01R 12/73* (2011.01)
(Continued)

(52) U.S. Cl.
CPC ........... *H01R 12/73* (2013.01); *H01R 12/716* (2013.01); *H01R 13/24* (2013.01); *H01R 13/6473* (2013.01)

(58) Field of Classification Search
CPC ...... H01R 12/73; H01R 12/716; H01R 13/24; H01R 13/6473; H01R 13/6477; H05K 2201/042; H05K 2201/10189; H05K 1/144
See application file for complete search history.

(56) References Cited

U.S. PATENT DOCUMENTS 5,567,166 A 10/1996 Lemke
8,888,508 B2 * 11/2014 Chen .................... H01R 12/716
439/74
(Continued)

FOREIGN PATENT DOCUMENTS

JP H09-017492 A 1/1997
JP H09-511865 A 11/1997
(Continued)

OTHER PUBLICATIONS

International Search Report issued in PCT/JP2019/045239; dated Feb. 4, 2020.
Written Opinion issued in PCT/JP2019/045239; dated Feb. 4, 2020.

*Primary Examiner* — Abdullah A Riyami
*Assistant Examiner* — Nelson R. Burgos-Guntin
(74) *Attorney, Agent, or Firm* — Studebaker & Brackett PC

(57) ABSTRACT

An electric connector set having an impedance adjustment function and a mounting structure, and including a first connector that mounts onto a first circuit board, and a second connector that mounts onto a second circuit to be insertable into and withdrawable from the first connector in an insertion-withdrawal direction. The first connector includes a first connection terminal having first mounting portions to mount onto first land portions on the first circuit board and a first insulating member that holds the first connection terminal. The second connector includes a second connection terminal having second mounting portions to mount onto second land portions on the second circuit board and a second insulating member that holds the second connection terminal. In an engagement state of the electric connector set, the first mounting portions oppose the second mounting portions and overlap the second mounting portions as viewed in the insertion-withdrawal direction.

20 Claims, 13 Drawing Sheets

(51) Int. Cl.
*H01R 13/24* (2006.01)
*H01R 13/6473* (2011.01)

(56) References Cited

U.S. PATENT DOCUMENTS

| | | | | |
|---|---|---|---|---|
| 9,893,480 | B2* | 2/2018 | Kodaira | H01R 24/60 |
| 2013/0178076 | A1* | 7/2013 | Huang | H01R 12/73 |
| | | | | 439/65 |
| 2013/0260589 | A1* | 10/2013 | Chen | H01R 12/716 |
| | | | | 439/284 |
| 2015/0311610 | A1* | 10/2015 | Little | H01R 12/707 |
| | | | | 439/284 |
| 2017/0070014 | A1* | 3/2017 | Kodaira | H01R 24/60 |
| 2017/0271813 | A1* | 9/2017 | Ge | H01R 13/504 |

FOREIGN PATENT DOCUMENTS

| | | |
|---|---|---|
| JP | H10-172694 A | 6/1998 |
| JP | 2007-115578 A | 5/2007 |
| JP | 2015-008053 A | 1/2015 |
| JP | 2016-195056 A | 11/2016 |
| WO | 2016/178356 A1 | 11/2016 |

* cited by examiner

ELECTRIC CONNECTOR SET AND MOUNTING STRUCTURE OF ELECTRIC CONNECTOR SET

CROSS-REFERENCE TO RELATED APPLICATIONS

This application claims benefit of priority to International Patent Application No. PCT/JP2019/045239, filed Nov. 19, 2019, and to Japanese Patent Application No. 2018-227456, filed Dec. 4, 2018, the entire contents of each are incorporated herein by reference.

BACKGROUND

Technical Field

The present disclosure relates to an electric connector set in which a first connector and a second connector engage each other and a mounting structure of the electric connector set.

Background Art

International Publication No. 2016/178356 discloses an example of an electric connector set in which a connector having multipolar connection terminals engages another connector having other connection terminals configured to engage the multipolar connection terminals. In the connector, the connection terminals are fitted into grooves of an insulating member and fixed to the insulating member, and a mounting portion of each of the connection terminals is connected to a land portion of a circuit board. Similarly, in the other connector, the other connection terminals are fitted into grooves of another insulating member and fixed to the other insulating member, and a mounting portion of each of the other connection terminals is electrically connected to a land portion of another circuit board.

SUMMARY

In the electric connector set of International Publication No. 2016/178356, the mounting portion of the connection terminal extends in a direction opposite to the direction in which the mounting portion of the other connection terminal extends. The mounting portion of the connection terminal and the mounting portion of the other connection terminal do not oppose each other and do not overlap each other as viewed in an insertion-withdrawal direction. Accordingly, electrostatic capacity is not generated between the mounting portion of the connection terminal and the mounting portion of the other connection terminal.

When a high-frequency signal is transmitted between two electrically connected circuit boards, the impedance of the two circuit in a high-frequency band, such as megahertz or gigahertz band, need to be matched. Otherwise, transmission loss of the high-frequency signal occurs due to greater reflection of the high-frequency signal. To avoid this, an impedance matching circuit is normally connected to each input and output terminal of the circuit board. To implement impedance matching, the impedance matching circuit, which includes an inductor, a capacitor, or the like, is formed in an electronic component mounted on the circuit board or formed in the circuit board by patterning a conductor. In other words, the known electric connector set itself does not include an impedance adjustment function for adjusting characteristic impedance.

In the present disclosure, a problem is to provide an electric connector set having an impedance adjustment function for adjusting characteristic impedance and a mounting structure of such an electric connector set.

Therefore, according to an aspect of the present disclosure, an electric connector set includes a first connector configured to be mounted onto a first circuit board and a second connector configured to be mounted onto a second circuit board and to engage the first connector so as to be insertable into and withdrawable from the first connector in an insertion-withdrawal direction. The first connector includes a first connection terminal having a first mounting portion to be mounted onto a first land portion disposed on the first circuit board and a first insulating member that holds the first connection terminal. The second connector includes a second connection terminal having a second mounting portion to be mounted onto a second land portion disposed on the second circuit board and a second insulating member that holds the second connection terminal. In addition, in an engagement state of the electric connector set, the first mounting portion opposes the second mounting portion and overlaps the second mounting portion as viewed in the insertion-withdrawal direction.

According to another aspect of the present disclosure, a mounting structure of an electric connector set includes a first circuit board having a first land portion, a second circuit board having a second land portion, and an electric connector set. The electric connector set includes a first connector configured to be mounted on the first circuit board and a second connector configured to be mounted on the second circuit board and to engage the first connector so as to be insertable into and withdrawable from the first connector in an insertion-withdrawal direction. The first connector includes a first connection terminal and a first insulating member that holds the first connection terminal. The second connector includes a second connection terminal and a second insulating member that holds the second connection terminal. The first connection terminal has a first mounting portion, and the first mounting portion is mounted on the first land portion. The second connection terminal has a second mounting portion, and the second mounting portion is mounted on the second land portion. In addition, in an engagement state of the electric connector set, the first mounting portion is disposed so as to overlap the second mounting portion as viewed in the insertion-withdrawal direction.

According to the above configuration, in the engagement state of the electric connector set, the first mounting portion opposes and overlaps the second mounting portion as viewed in the insertion-withdrawal direction. Electrostatic capacity is thereby generated between the first mounting portion and the second mounting portion. The electrostatic capacity can serve like a capacitor for adjusting characteristic impedance. Accordingly, the electric connector set itself has an impedance adjustment function for adjusting the characteristic impedance. The mounting structure of the electric connector set itself also has the impedance adjustment function for adjusting the characteristic impedance.

DETAILED DESCRIPTION

Figure 1:
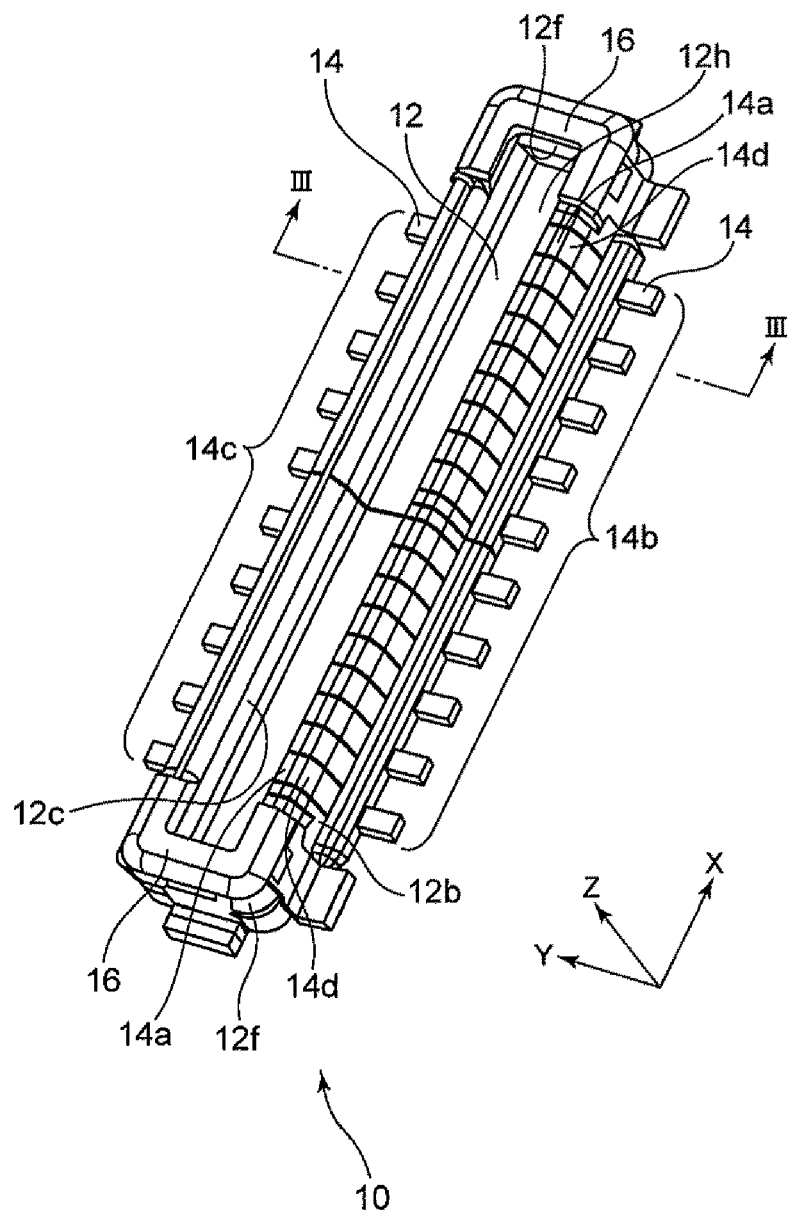
FIG. 1 is a perspective view illustrating a first connector that constitutes an electric connector set according to one embodiment.

One embodiment of an electric connector set 30 and a mounting structure of the electric connector set 30 according to the present disclosure will be described with reference to the drawings. Note that the X-axis, Y-axis, and Z-axis, which are orthogonally intersecting each other, are indicated in the drawings for convenience of explanation.

Electric Connector Set

Figure 7:
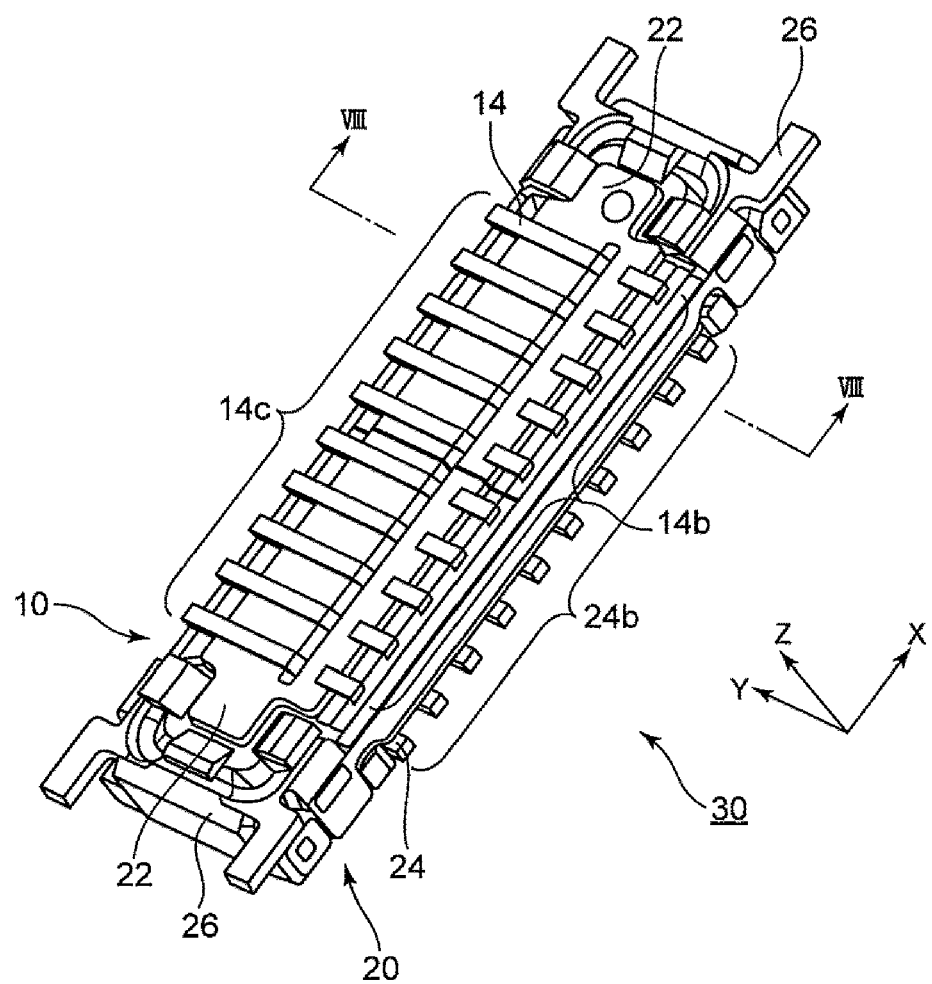
FIG. 7 is a perspective view illustrating the electric connector set that is in an engagement state.

FIG. 7 is a perspective view illustrating an electric connector set 30 according to the embodiment. The electric connector set 30 is in an engagement state.

As illustrated in FIG. 7, the electric connector set 30 includes a first connector 10 and a second connector 20 configured to engage the first connector 10. The second connector 20 can be inserted into, and withdrawn from, the first connector 10 in the insertion-withdrawal direction (in the Z-axis direction). As illustrated in FIG. 7, the first connector 10 and the second connector 20 of the electric connector set 30 engage each other by moving the second connector 20 to the first connector 10 in the insertion-withdrawal direction (Z-axis direction) with the second connector 20 facing the first connector 10.

First Connector

Figure 2:
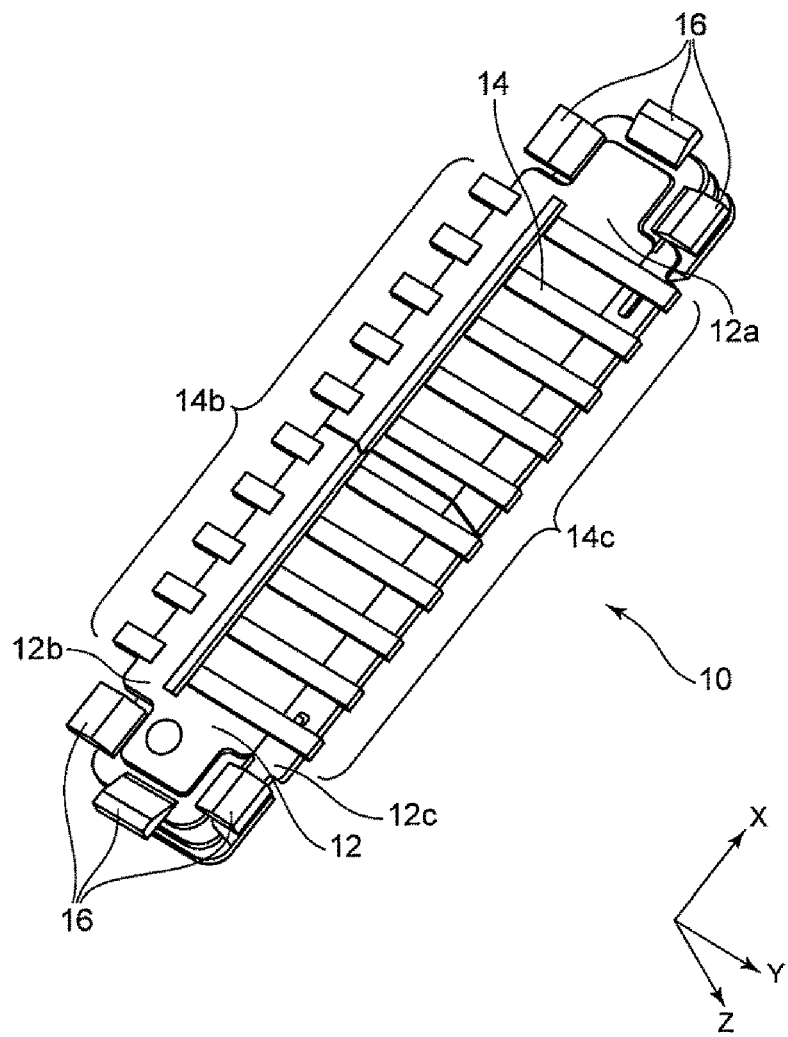
FIG. 2 is a perspective view illustrating the first connector of FIG. 1 when the bottom side of the first connector is viewed.
Figure 3:
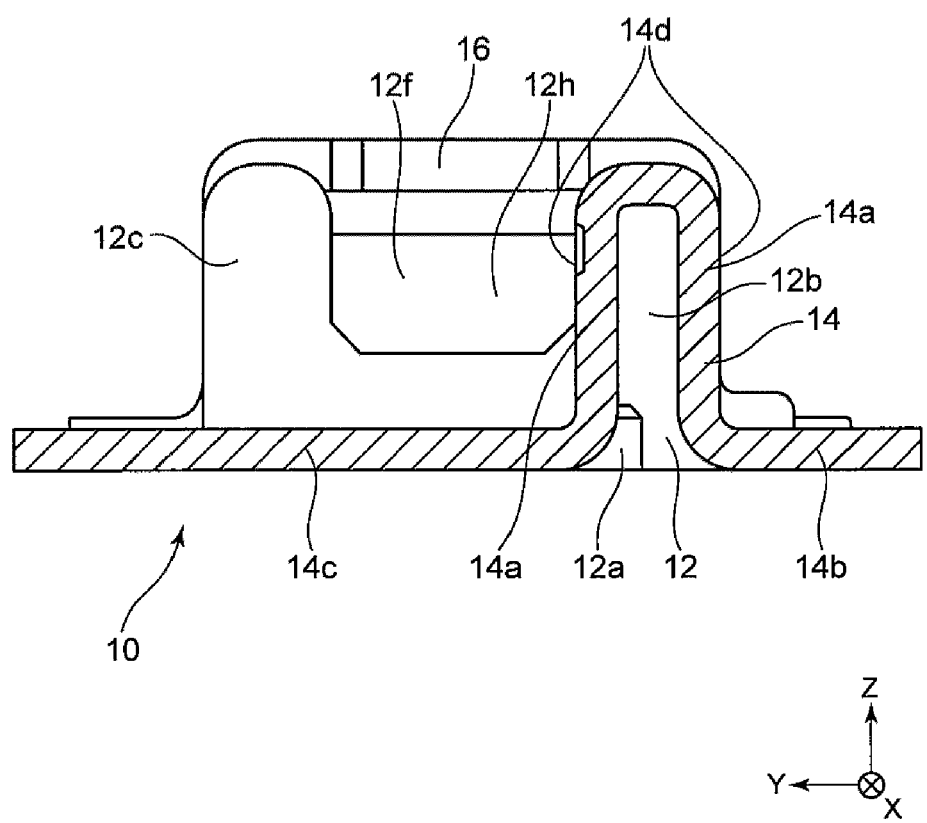
FIG. 3 is a cross section of the first connector taken along line in FIG. 1.

FIG. 1 is a perspective view illustrating the first connector 10 that constitutes the electric connector set 30 of FIG. 7. FIG. 2 is a perspective view illustrating the first connector 10 of FIG. 1 when the bottom side thereof is viewed. FIG. 3 is a cross section of the first connector 10 taken along line in FIG. 1.

As illustrated in FIGS. 1 and 2, the first connector 10 includes a first insulating member 12, multiple first connection terminals 14, two first externally grounded members 16 and 16 (otherwise simply denoted by "first externally grounded members 16").

The first insulating member 12 is made of an electrically insulating resin (for example, liquid crystalline polymer). The liquid crystalline polymer has a dielectric constant greater than that of fluororesin. The first insulating member 12 is shaped like a rectangle as viewed in the insertion-withdrawal direction (Z-axis direction). The first insulating member 12 has a first bottom wall 12a, one first longitudinal wall 12b and the other first longitudinal wall 12c, two first lateral walls 12f, and a first recess 12h.

The one first longitudinal wall 12b and the other first longitudinal wall 12c extend in the longitudinal direction (in the X-axis direction) so as to be parallel to each other and oppose each other. The two first lateral walls 12f extend in the lateral direction (in the Y-axis direction) so as to be parallel to each other and oppose each other. The first recess 12h is a space surrounded by the first bottom wall 12a, the one first longitudinal wall 12b, the other first longitudinal wall 12c, and the two first lateral walls 12f. Portions of the one first longitudinal wall 12b are recessed for receiving first connection terminals. The first connection terminals 14 are mounted in respective portions for receiving first connection terminals. The one first longitudinal wall 12b thereby supports the first connection terminals 14 in an electrically insulating manner.

Each first connection terminal 14 is disposed so as to extend in the lateral direction of the first connector 10 (in the Y-axis direction). As illustrated in FIG. 3, each first connection terminal 14 has a first engagement portion 14a that is bent, for example, convexly like an inverted U-shaped protrusion. Accordingly, the first connection terminals 14 may be often called "male-type multipolar connection terminals". The first connection terminals 14 illustrated by way of example in FIG. 1 include ten connection terminals arranged in one row extending in the longitudinal direction (in the X-axis direction).

Note that the arrangement of the multipolar first connection terminals 14 is not limited to this. The first connection terminals 14 may be arranged in two rows or more. The number of the first connection terminals 14 in one row is not limited to ten but may be one or more. An electrically conductive shield member (not illustrated) may be disposed between adjacent rows of the first connection terminals 14 to reduce electromagnetic interference between rows of the first connection terminals 14. Note that although the first connection terminals 14 are convexly shaped connection terminals, the first connection terminals 14 may be concavely shaped connection terminals. In this case, second connection terminals 24 to engage the first connection terminals 14 are convexly shaped connection terminals instead of concavely shaped ones.

The first connection terminals 14 are arranged side by side in the longitudinal direction (in the X-axis direction). Each first connection terminal 14 is a conductor connected, for example, to signal potential or to ground potential. The first connection terminal 14 is formed by bending a conductive rod-like member. For example, the first connection terminal 14 is made of phosphor bronze. The phosphor bronze is an elastically deformable electroconductive material. The surface of the first connection terminal 14 may be plated, for example, with gold. The signal passing through the first connection terminal 14 is a high-frequency signal, for example, in megahertz or gigahertz band.

Each first connection terminal 14 has a first engagement portion 14a and also has one first mounting portion 14b and the other first mounting portion 14c. As illustrated in FIG. 3, the first engagement portion 14a is disposed on the one first longitudinal wall 12b of the first insulating member 12. The first engagement portion 14a is formed convexly like the inverted U-shaped protrusion. When the first connection terminal 14 engages a corresponding second connection terminal 24, two first contact portions (or contact portions)

14d are generated on the first engagement portion 14a. The one first mounting portion 14b extends from the first engagement portion 14a toward one side in the lateral direction (in the Y-axis direction). The one first mounting portion 14b extends to a position outside the one first longitudinal wall 12b. The other first mounting portion 14c extends in a direction opposite to the direction in which the one first mounting portion 14b extends with respect to the first insulating member 12. In other words, the other first mounting portion 14c extends from the first engagement portion 14a toward the other side in the lateral direction (in the Y-axis direction). The other first mounting portion 14c extends to a position outside the other first longitudinal wall 12c.

The first externally grounded members 16 are disposed at respective first lateral walls 12f. In other words, the first externally grounded members 16 are disposed so as to oppose each other in the longitudinal direction (in the X-axis direction) with a space interposed therebetween. Each first externally grounded member 16 serves to engage a corresponding second externally grounded member 26 of the second connector 20, which will be described later. The first externally grounded member 16 also serves as a ground terminal to be electrically connected to ground potential.

The first externally grounded member 16 is a conductor to be connected to ground potential. For example, the first externally grounded member 16 may be made of phosphor bronze. The phosphor bronze is an elastically deformable electroconductive material. For example, the first externally grounded member 16 is formed by bending. The first externally grounded member 16, which is connected to ground potential, can shield a space surrounded by the first externally grounded member 16 from electromagnetic waves coming from the outside of the first connector 10 and also from spurious radiation of the first connection terminals 14.

Second Connector

Figure 4:
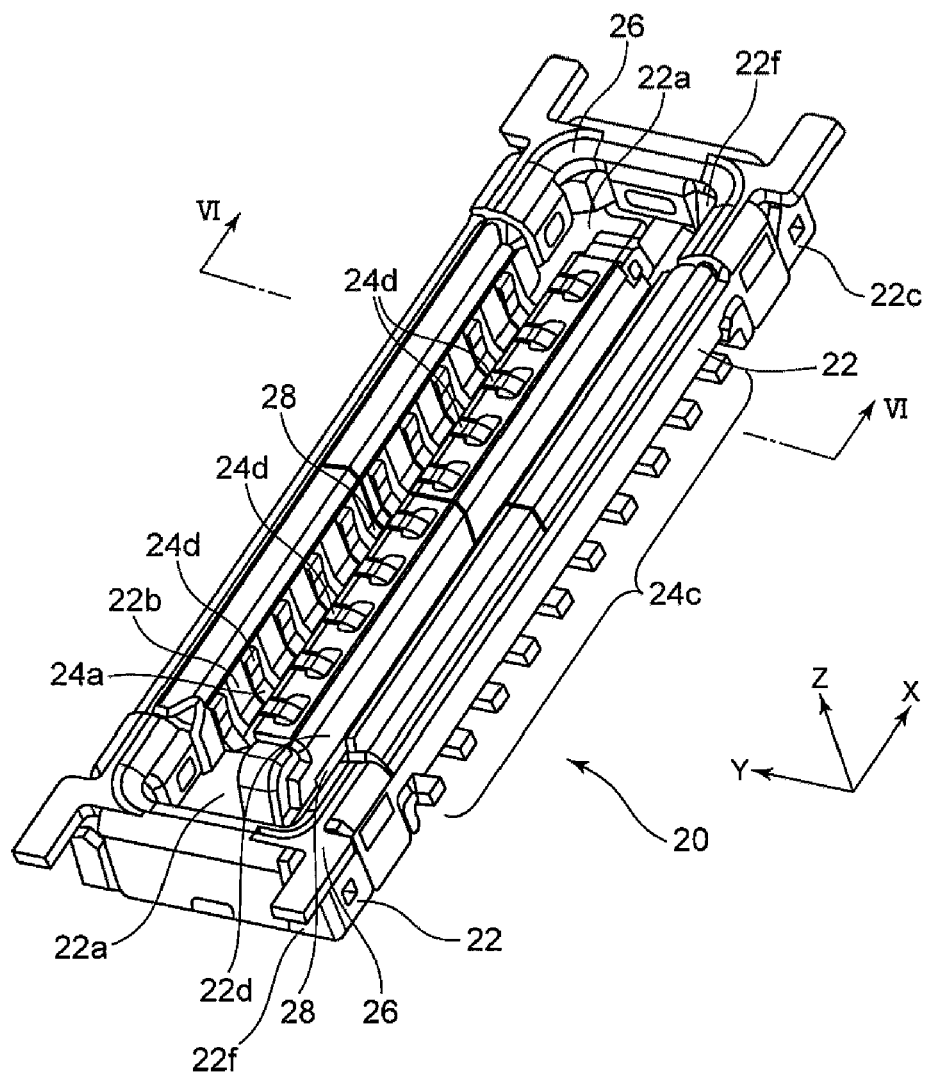
FIG. 4 is a perspective view illustrating a second connector that constitutes the electric connector set according to the one embodiment.
Figure 5:
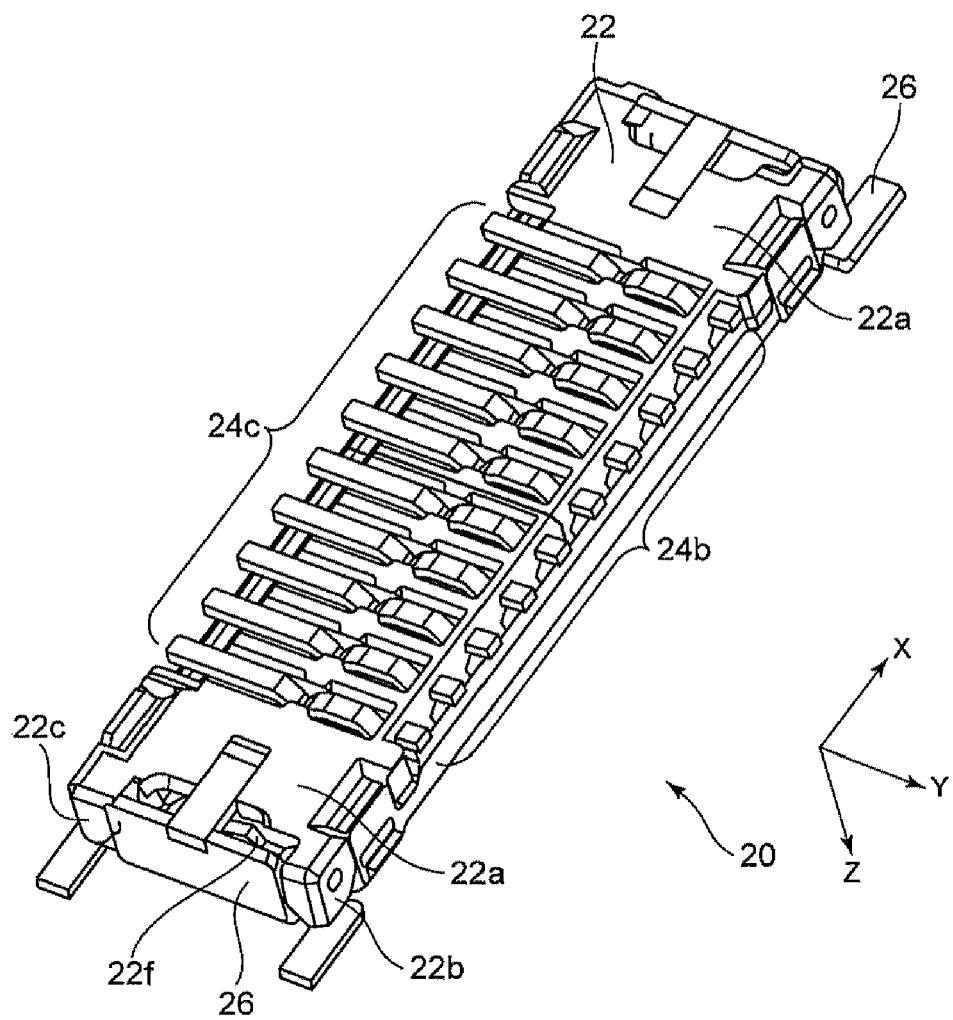
FIG. 5 is a perspective view illustrating the second connector of FIG. 4 when the bottom side of the second connector is viewed.
Figure 6:
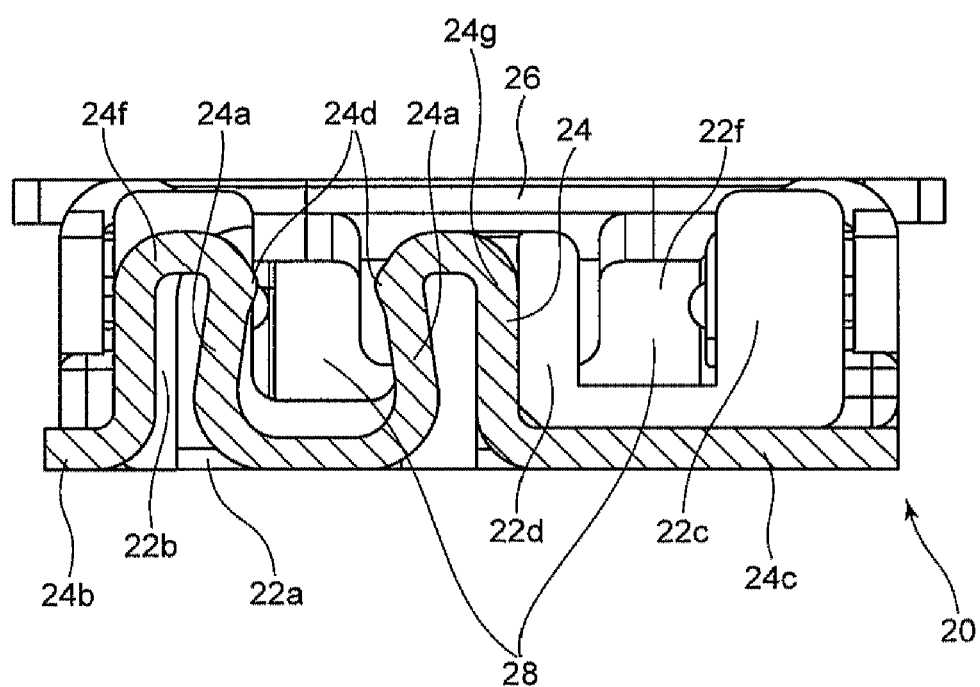
FIG. 6 is a cross section of the second connector taken along line VI-VI in FIG. 4.
Figure 6:
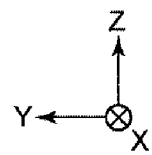

FIG. 4 is a perspective view illustrating the second connector 20 that constitutes the electric connector set 30 of FIG. 7. FIG. 5 is a perspective view illustrating the second connector 20 of FIG. 4 when the bottom side thereof is viewed. FIG. 6 is a cross section of the second connector 20 taken along line VI-VI in FIG. 4.

The second connector 20 includes a second insulating member 22, multiple second connection terminals 24, two second externally grounded members 26 and 26 (otherwise simply denoted by "second externally grounded members 26").

The second insulating member 22 is made of an electrically insulating resin (for example, liquid crystalline polymer). The liquid crystalline polymer has a dielectric constant greater than that of fluororesin. The second insulating member 22 is shaped like a rectangle as viewed in the insertion-withdrawal direction (Z-axis direction). The second insulating member 22 has a second bottom wall 22a, one second longitudinal wall 22b and the other second longitudinal wall 22c, two second lateral walls 22f, a second protrusion 22d, and a second recess 28.

The one second longitudinal wall 22b and the other second longitudinal wall 22c extend in the longitudinal direction (in the X-axis direction) so as to be parallel to each other and oppose each other. The two second lateral walls 22f extend in the lateral direction (in the Y-axis direction) so as to be parallel to each other and oppose each other. The second protrusion 22d extends in the longitudinal direction (in the X-axis direction) so as to be parallel to the one second longitudinal wall 22b and the other second longitudinal wall 22c. The second protrusion 22d protrudes so as to match the first recess 12h so that the second protrusion 22d can be accommodated in the first recess 12h. The second recess 28 is a space for receiving the one second longitudinal wall 22b, the other second longitudinal wall 22c, and the two second lateral walls 22f. Portions of the one second longitudinal wall 22b and portions of the second protrusion 22d are recessed for receiving second connection terminals. The second connection terminals 24 are mounted in respective portions for receiving second connection terminals. The one second longitudinal wall 22b and the second protrusion 22d thereby support the second connection terminals 24 in an electrically insulating manner.

Each second connection terminal 24 is disposed so as to extend in the lateral direction of the second connector 20 (in the Y-axis direction). As illustrated in FIG. 6, each second connection terminal 24 has a second engagement portion 24a that is bent, for example, concavely like a U-shaped recess. Accordingly, the second connection terminals 24 may be often called "female-type multipolar connection terminals". The second connection terminals 24 illustrated by way of example in FIG. 4 include ten connection terminals arranged in one row extending in the longitudinal direction (in the X-axis direction).

Note that the arrangement of the multipolar second connection terminals 24 is not limited to this. The second connection terminals 24 may be arranged in two rows or more. The number of the second connection terminals 24 in one row is not limited to ten but may be one or more. An electrically conductive shield member (not illustrated) may be disposed between adjacent rows of the second connection terminals 24 to reduce electromagnetic interference between rows of the second connection terminals 24. Note that although the second connection terminals 24 are concavely shaped connection terminals, the second connection terminals 24 may be convexly shaped connection terminals. In this case, the first connection terminals 14 to engage the second connection terminals 24 are concavely shaped connection terminals instead of convexly shaped ones.

The second connection terminals 24 are arranged side by side in the longitudinal direction (in the X-axis direction). Each second connection terminal 24 is a conductor connected, for example, to signal potential or to ground potential. The second connection terminal 24 is formed by bending a conductive rod-like member. For example, the second connection terminal 24 is made of phosphor bronze. The phosphor bronze is an elastically deformable electroconductive material. The surface of the second connection terminal 24 may be plated, for example, with gold. The signal passing through the second connection terminal 24 is a high-frequency signal, for example, in megahertz or gigahertz band.

Each second connection terminal 24 has a second engagement portion 24a, one second interposition portion 24f, one second mounting portion 24b, the other second interposition portion 24g, and the other second mounting portion 24c. As illustrated in FIG. 6, the second engagement portion 24a is disposed so as to extend from the one second longitudinal wall 22b to the second protrusion 22d in the second insulating member 22. The second engagement portion 24a is formed concavely like a U-shaped recess. When the second connection terminal 24 engages the corresponding first connection terminal 14, two second contact portions (i.e., contact portions) 24d are generated on the second engagement portion 24a.

The one second interposition portion 24f is formed at one side of the second engagement portion 24a. The one second interposition portion 24f has a longitudinal cross section shaped like an inverted letter L and connects between the second engagement portion 24a and the one second mounting portion 24b. The other second interposition portion 24g is formed at the other side of the second engagement portion 24a. The other second interposition portion 24g has a longitudinal cross section shaped like an inverted letter L and connects between the second engagement portion 24a and the other second mounting portion 24c.

The one second mounting portion 24b extends from the second engagement portion 24a toward one side in the lateral direction (in the Y-axis direction). The one second mounting portion 24b extends to a position outside the one second longitudinal wall 22b. The other second mounting portion 24c extends in a direction opposite to the direction in which the one second mounting portion 24b extends with respect to the second insulating member 22. In other words, the other second mounting portion 24c extends from the second engagement portion 24a toward the other side in the lateral direction (in the Y-axis direction). The other second mounting portion 24c extends to a position outside the other second longitudinal wall 22c.

The second externally grounded members 26 are disposed at respective second lateral walls 22f. In other words, the second externally grounded members 26 are disposed so as to oppose each other in the longitudinal direction (in the X-axis direction) with a space interposed therebetween. Each second externally grounded member 26 serves to guide the corresponding first externally grounded member 16 of the first connector 10 when connected to the first externally grounded member 16. The second externally grounded member 26 also serves as a ground terminal to be electrically connected to ground potential.

The second externally grounded member 26 is a conductor to be connected to ground potential. For example, the second externally grounded member 26 may be made of phosphor bronze. The phosphor bronze is an elastically deformable electroconductive material. For example, the second externally grounded member 26 is formed by bending. The second externally grounded member 26, which is connected to ground potential, can shield a space surrounded by the second externally grounded member 26 from electromagnetic waves coming from the outside of the second connector 20 and also from spurious radiation of the second connection terminals 24.

Engagement Structure of Electric Connector Set

Figure 8:
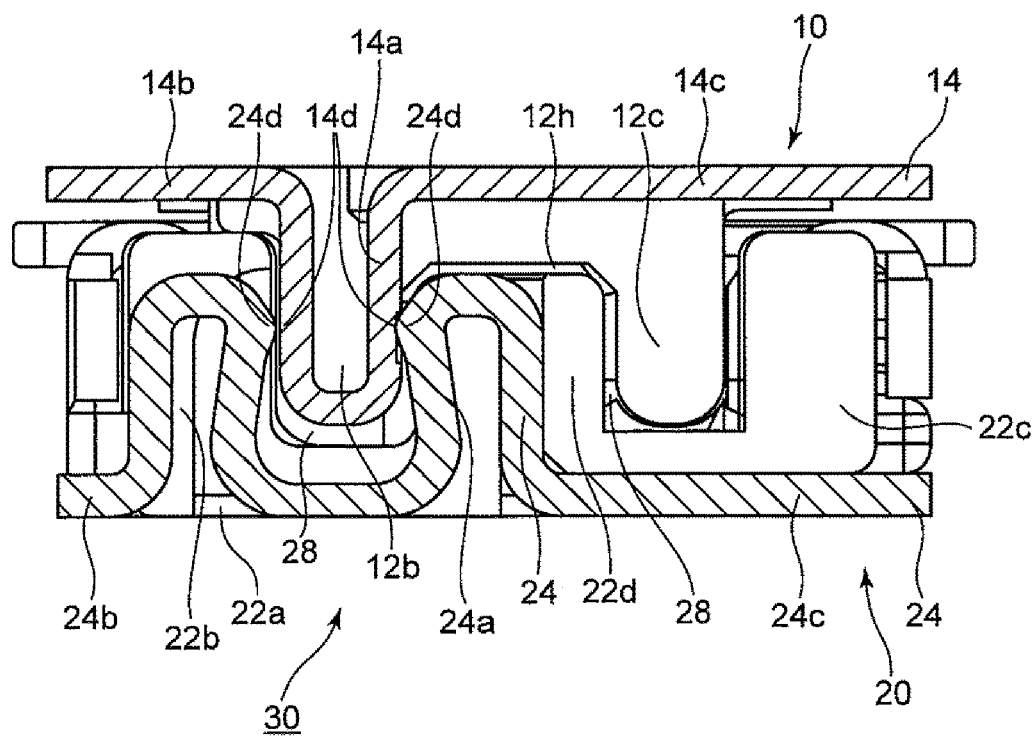
FIG. 8 is a cross section of the electric connector set taken along line VIII-VIII in FIG. 7.
Figure 8:
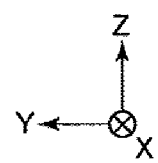

FIG. 7 is a perspective view illustrating the electric connector set 30 being in an engagement state. FIG. 8 is a cross section of the electric connector set 30 taken along line VIII-VIII in FIG. 7.

The first connector 10 and the second connector 20 of the electric connector set 30 engage each other by pushing the first connector 10 into the second connector 20 in the insertion-withdrawal direction (Z-axis direction) with the first connector 10 facing the second connector 20.

Here, as illustrated in FIG. 7, the first externally grounded members 16 of the first connector 10 engage the second externally grounded members 26 of the second connector 20. Simultaneously, the one first longitudinal wall 12b, the other first longitudinal wall 12c, and the two first lateral walls 12f of the first insulating member 12 are fitted into the second recess 28 of the second insulating member 22. The second protrusion 22d of the second insulating member 22 is also fitted into the first recess 12h of the first insulating member 12. With this configuration, the first insulating member 12 and the second insulating member 22 engage each other entirely and thereby stably, which can prevent undesirable disengagement.

In the engagement state, as illustrated in FIG. 8, the first engagement portion 14a of the first connection terminal 14 engages the second engagement portion 24a of the corresponding second connection terminal 24. This electrically connects the first contact portions 14d of the first engagement portion 14a to the second contact portions 24d of the second engagement portion 24a.

Mounting Structure of Electric Connector Set Mounted onto Circuit Board

Figure 9:
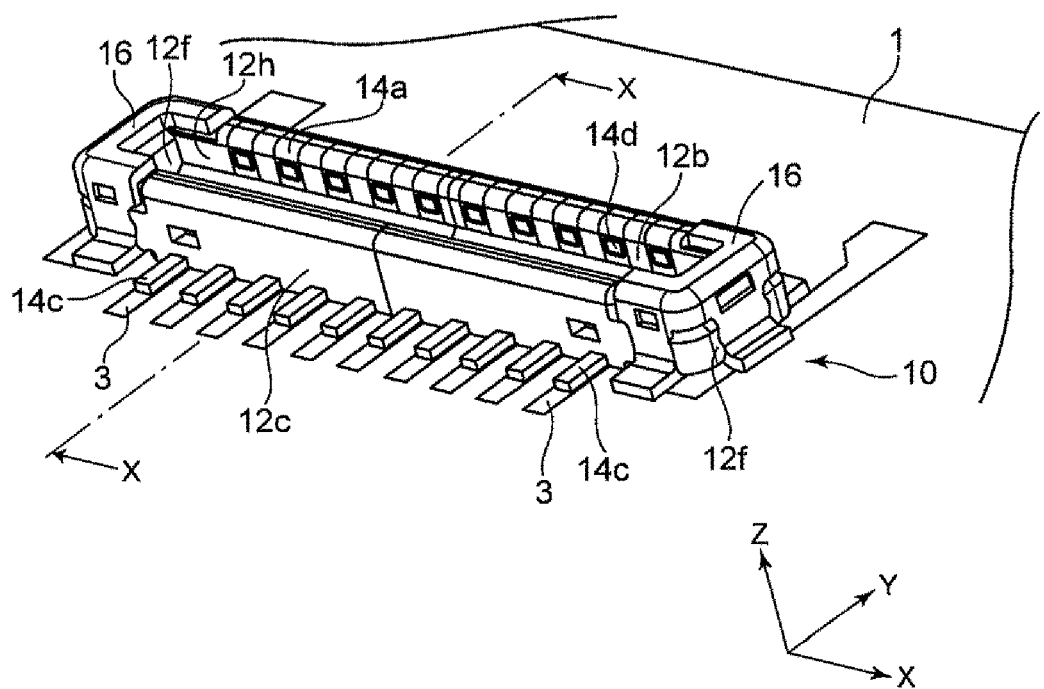
FIG. 9 is a perspective view illustrating the first connector of FIG. 1 that is mounted on a first circuit board.
Figure 10:
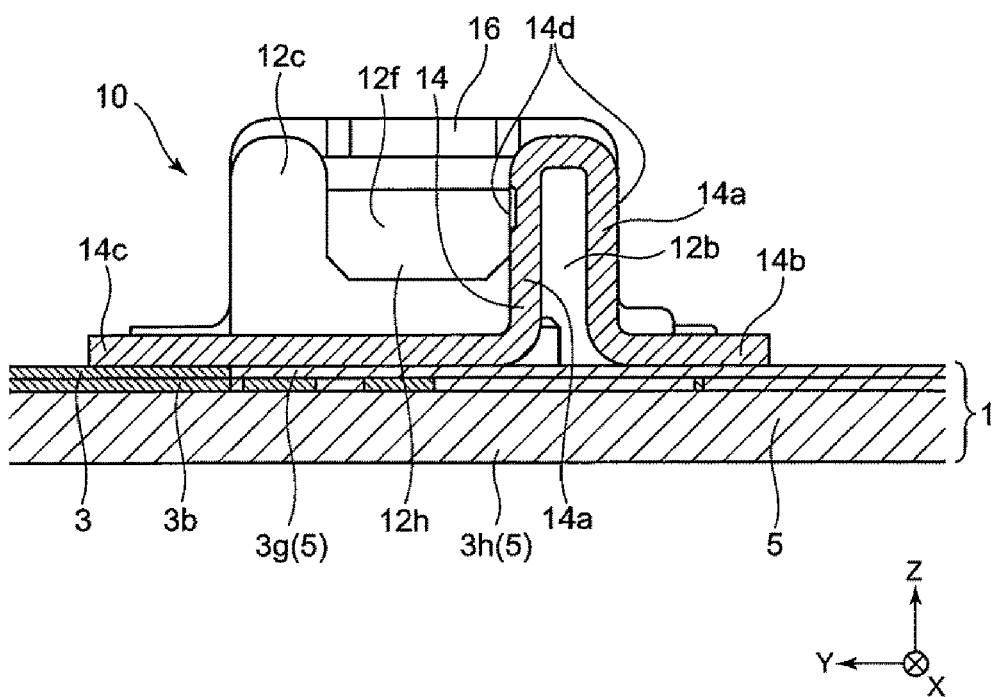
FIG. 10 is a cross section of the first connector taken along line X-X in FIG. 9.
Figure 11:
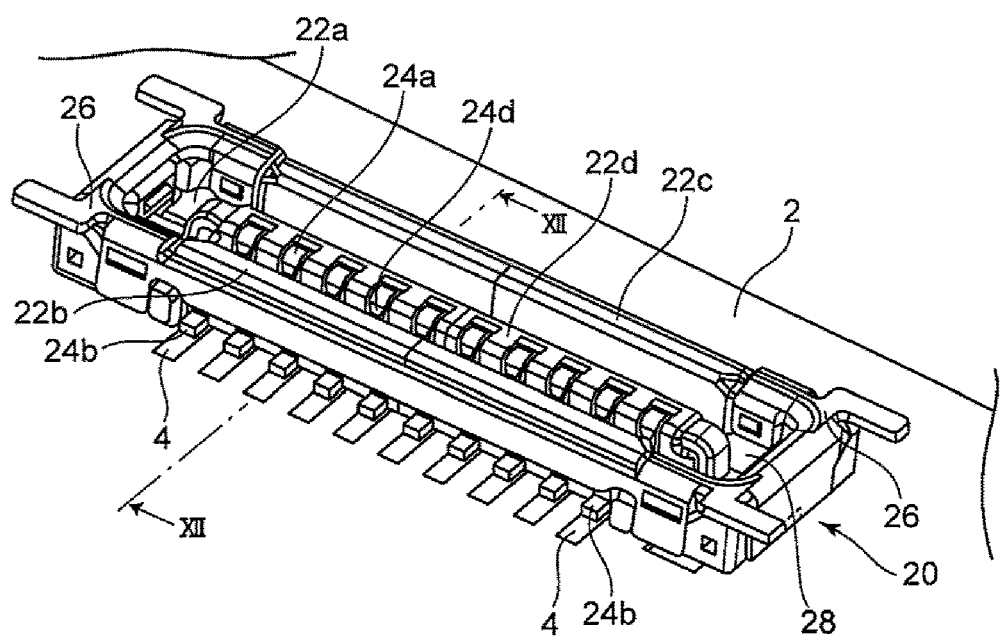
FIG. 11 is a perspective view illustrating the second connector of FIG. 4 that is mounted on a second circuit board.
Figure 12:
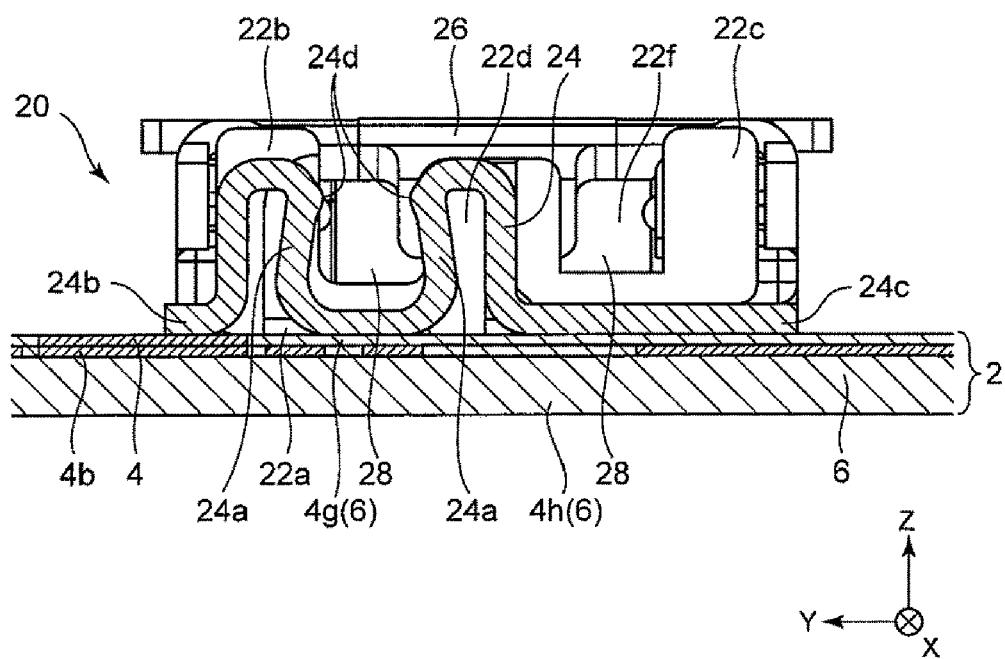
FIG. 12 is a cross section of the second connector taken along line XII-XII in FIG. 11.

FIG. 9 is a perspective view illustrating the first connector 10 of FIG. 1 that is mounted on a first circuit board 1. FIG. 10 is a cross section of the first connector 10 taken along line X-X in FIG. 9. FIG. 11 is a perspective view illustrating the second connector 20 of FIG. 4 that is mounted on a second circuit board 2. FIG. 12 is a cross section of the second connector 20 taken along line XII-XII in FIG. 11.

As illustrated in FIG. 9, the first connector 10 is mounted on the first circuit board 1. As illustrated in FIG. 10, the first circuit board 1 is formed, for example, by laminating, in the order from the side facing the first connector 10, a first inner grounding layer, a first insulating layer 3g (first insulating portion 5), a first conductive layer 3b, a second insulating layer 3h (first insulating portion 5), and a first outer grounding layer. First land portions 3 are formed at a side of the first inner grounding layer 3a, and the first land portions 3 are connected to the first conductive layer 3b through via conductors. Note that the first insulating layer 3g and the second insulating layer 3h function as a first insulating portion 5. The first insulating layer 3g and the second insulating layer 3h may be made of the same material.

The one first mounting portion 14b and the other first mounting portion 14c of each first connection terminal 14 are mounted onto respective first land portions 3. The one first mounting portion 14b and the other first mounting portion 14c are electrically connected to the first land portions 3 using conductive members such as solder bumps.

As illustrated in FIG. 11, the second connector 20 is mounted on the second circuit board 2. As illustrated in FIG. 12, the second circuit board 2 is formed, for example, by laminating, in the order from the side facing the second connector 20, a second inner grounding layer, a third insulating layer 4g (second insulating portion 6), a second conductive layer 4b, a fourth insulating layer 4h (second insulating portion 6), and a second outer grounding layer. Second land portions 4 are formed at a side of the second inner grounding layer, and the second land portions 4 are connected to the second conductive layer 4b through via conductors. Note that the third insulating layer 4g and the fourth insulating layer 4h function as a second insulating portion 6. The third insulating layer 4g and the fourth insulating layer 4h may be made of the same material.

The one second mounting portion 24b and the other second mounting portion 24c of each second connection terminal 24 are mounted onto respective second land portions 4. The one second mounting portion 24b and the other second mounting portion 24c are electrically connected to the second land portions 4 using conductive members such as solder bumps.

The material of the first and second insulating layers of the first circuit board 1 and of the third and fourth insulating layers of the second circuit board 2 is preferably a material having a small relative dielectric constant E and a small dielectric loss tangent tan δ. Such a material having a small relative dielectric constant and a small dielectric loss tangent may be fluororesin such as polytetrafluoroethylene (PTFE).

Accordingly, the dielectric constant of the insulating layers of the first circuit board 1 and the second circuit board 2 is set to be smaller than that of the first insulating member 12 and of the second insulating member 22. This can reduce the dielectric loss in high-frequency bands, such as megahertz band or gigahertz band. In addition, this can increase electrostatic capacity generated between the first mounting portions 14b and 14c of the first connector 10 and the second mounting portions 24b and 24c of the second connector 20, which is described below.

Figure 13:
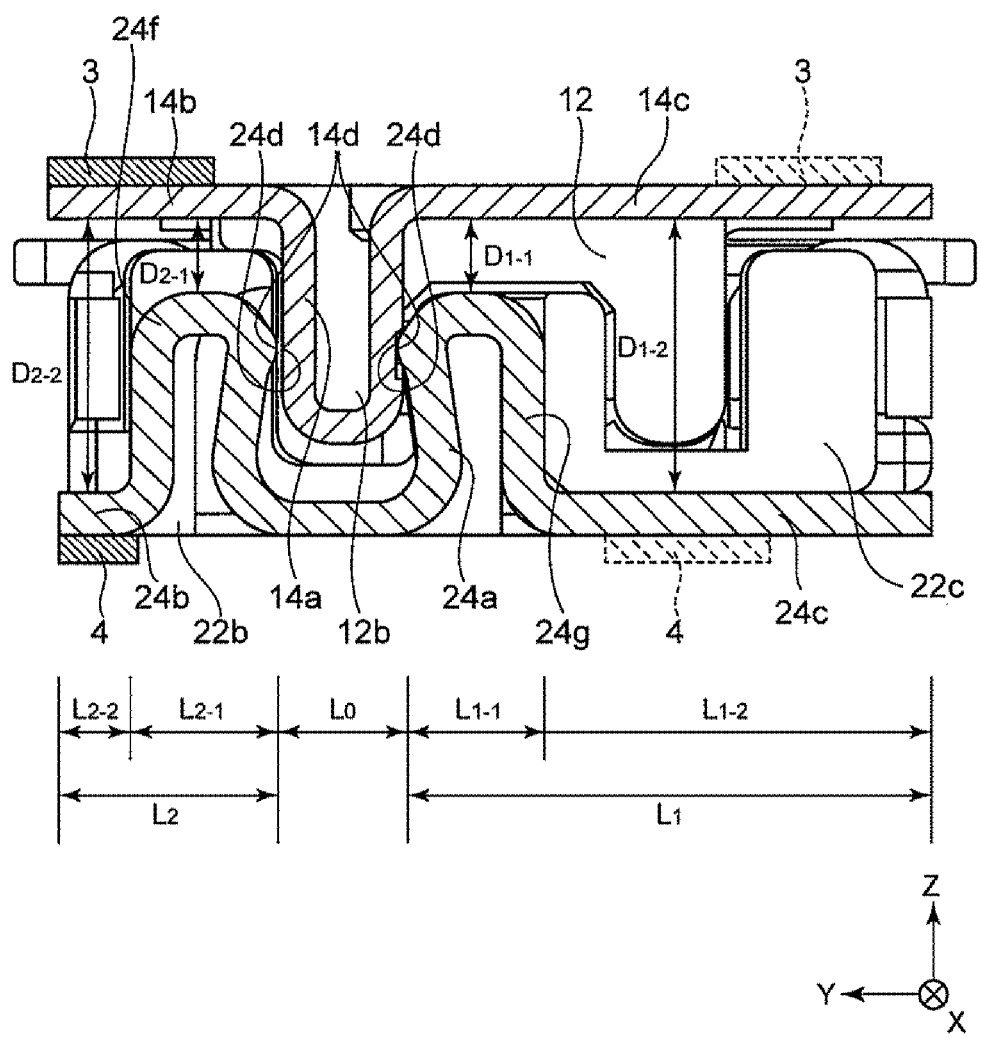
FIG. 13 is a cross-sectional view provided for explanation of electrostatic capacity generated between a first mounting portion of the first connector and a second mounting portion of the second connector.

Electrostatic Capacity Generated Between First Mounting Portion and Second Mounting Portion FIG. 13 is a cross-sectional view provided for explanation of electrostatic capacity generated between the first mounting portions 14b and 14c of the first connector 10 and the second mounting portions 24b and 24c of the second connector 20.

In the engagement state illustrated in FIG. 13, the first engagement portion 14a of the first connection terminal 14 engages the second engagement portion 24a of the second connection terminals 24. The engagement between the first engagement portion 14a and the second engagement portion 24a brings the first contact portions 14d of the first engagement portion 14a into electrical contact with the second contact portions 24d of the second engagement portion 24a. The two first contact portions 14d are spaced in the Y-axis direction by a contact distance $L_0$. The two second contact portions 24d are spaced in the Y-axis direction also by the contact distance $L_0$.

The one first mounting portion 14b extends for an extension length $L_2$ from the first engagement portion 14a toward the one side in the Y-axis direction. The one second mounting portion 24b and the second engagement portion 24a are connected by the one second interposition portion 24f that is shaped like an inverted letter L. The one second mounting portion 24b extends for a length $L_{2-2}$ from the one second interposition portion 24f toward the one side in the Y-axis direction.

The one second mounting portion 24b is spaced from the one first mounting portion 14b in the engagement direction (in the Z-axis direction) by a distance $D_{2-2}$. In addition, the one second mounting portion 24b and the one first mounting portion 14b are positioned so as to have an overlapping length $L_{2-2}$ in the Y-axis direction. In other words, as viewed in the engagement direction (in the Z-axis direction), the one second mounting portion 24b and the one first mounting portion 14b overlap each other so as to form a first overlapping region $L_{2-2}$. In addition, a first land portion 3 and a second land portion 4 are positioned at the first overlapping region $L_{2-2}$. The first insulating member 12 and the second insulating member 22 that have a high dielectric constant are disposed between the one first mounting portion 14b and the one second mounting portion 24b. Accordingly, electrostatic capacity is generated in the first overlapping region $L_{2-2}$ between the one first mounting portion 14b and the one second mounting portion 24b.

The one second interposition portion 24f is spaced from the one first mounting portion 14b in the engagement direction (in the Z-axis direction) by a distance $D_{2-1}$. In addition, the one second interposition portion 24f and the one first mounting portion 14b are positioned so as to have an overlapping length $L_{2-1}$ in the Y-axis direction. The first insulating member 12 and the second insulating member 22 that have a high dielectric constant are disposed between the one first mounting portion 14b and the one second interposition portion 24f. Accordingly, electrostatic capacity is generated between the one first mounting portion 14b and the one second interposition portion 24f. The electrostatic capacity can be changed appropriately by changing the area and the distance of the overlapping region between the one first mounting portion 14b and the one second mounting portion 24b and/or by changing the dielectric constant of the first insulating member 12 and the second insulating member 22.

Thus, electrostatic capacity is generated at one side of the first engagement portion 14a between the one first mounting portion 14b and the one second mounting portion 24b and also between the one first mounting portion 14b and the one second interposition portion 24f, and the electrostatic capacity can be adjusted appropriately.

The other first mounting portion 14c extends for an extension length $L_1$ from the first engagement portion 14a toward the other side in the Y-axis direction. The other second mounting portion 24c and the second engagement portion 24a are connected by the other second interposition portion 24g that is shaped like an inverted letter L. The other second mounting portion 24c extends for a length $L_{1-2}$ from the other second interposition portion 24g toward the other side in the Y-axis direction.

The other second mounting portion 24c is spaced from the other first mounting portion 14c in the engagement direction (in the Z-axis direction) by a distance $D_{1-2}$. In addition, the other second mounting portion 24c and the other first mounting portion 14c are positioned so as to have an overlapping length $L_{1-2}$ in the Y-axis direction. In other words, as viewed in the engagement direction (in the Z-axis direction), the other second mounting portion 24c and the other first mounting portion 14c overlap each other so as to form a second overlapping region $L_{1-2}$. In addition, the area of the first overlapping region $L_{2-2}$ described above is set to be smaller than the area of the second overlapping region $L_{1-2}$. The first insulating member 12 and the second insulating member 22 that have a high dielectric constant are disposed between the other first mounting portion 14c and the other second mounting portion 24c. Accordingly, electrostatic capacity is generated in the second overlapping region $L_{1-2}$ between the other first mounting portion 14c and the other second mounting portion 24c.

The other second interposition portion 24g is spaced from the other first mounting portion 14c in the engagement direction (in the Z-axis direction) by a distance $D_{1-1}$. In addition, the other second interposition portion 24g and the other first mounting portion 14c are positioned so as to have an overlapping length $L_{1-1}$ in the Y-axis direction. The first insulating member 12 and the second insulating member 22 that have a high dielectric constant are disposed between the other first mounting portion 14c and the other second interposition portion 24g. Accordingly, electrostatic capacity is generated between the other first mounting portion 14c and the other second interposition portion 24g. The electrostatic capacity can be changed appropriately by changing the area and the distance of the overlapping region between the other first mounting portion 14c and the other second mounting portion 24c and/or by changing the dielectric constant of the first insulating member 12 and the second insulating member 22.

Thus, electrostatic capacity is generated at the other side of the first engagement portion 14a between the other first mounting portion 14c and the other second mounting portion 24c and also between the other first mounting portion 14c and the other second interposition portion 24g, and the electrostatic capacity can be adjusted appropriately.

According to the above-described configuration, in the engagement state of the electric connector set 30, the first mounting portions 14b and 14c oppose and overlap the second mounting portions 24b and 24c as viewed in the insertion-withdrawal direction. Electrostatic capacity is thereby generated between the first mounting portions $14b$ and $14c$ and the second mounting portions $24b$ and $24c$. The electrostatic capacity serves like a capacitor for adjusting characteristic impedance. Accordingly, the electric connector set 30 itself has an impedance adjustment function for adjusting the characteristic impedance.

The combined extension length $L_1$ and $L_2$ (i.e., length $L_1+L_2$) of the first mounting portions $14b$ and $14c$, and the combined extension length $L_1$ and $L_2$ (i.e., length $L_1+L_2$) of the second mounting portions $24b$ and $24c$, are set to be greater than the contact distance $L_0$ between the two contact portions $14d$ and $24d$ that are formed when the first connection terminal 14 and the second connection terminal 24 are brought into electrical contact with each other. With this configuration, the electrostatic capacity can be increased even though the sizes of the first connection terminal 14 and the second connection terminal 24 are limited.

Wiring Design of First Circuit Board and Second Circuit Board

In FIG. 13, the one first mounting portion $14b$ can be electrically connected to a first land portion 3 indicated by a solid line, while the one second mounting portion $24b$ can be electrically connected to a second land portion 4 indicated by a solid line. In this case, an electrical path is formed to mutually connect the first land portion 3 indicated by the solid line, the one first mounting portion $14b$, the first engagement portion $14a$, the second engagement portion $24a$, the one second mounting portion $24b$, and the second land portion 4 indicated by the solid line.

In FIG. 13, the one first mounting portion $14b$ can be electrically connected to the first land portion 3 indicated by the solid line, while the other second mounting portion $24c$ can be electrically connected to a second land portion 4 indicated by a dotted line. In this case, an electrical path is formed to mutually connect the first land portion 3 indicated by the solid line, the one first mounting portion $14b$, the first engagement portion $14a$, the second engagement portion $24a$, the other second mounting portion $24c$, and the second land portion 4 indicated by the dotted line.

In FIG. 13, the other first mounting portion $14c$ can be electrically connected to a first land portion 3 indicated by a dotted line, while the one second mounting portion $24b$ can be electrically connected to the second land portion 4 indicated by the solid line. In this case, an electrical path is formed to mutually connect the first land portion 3 indicated by the dotted line, the other first mounting portion $14c$, the first engagement portion $14a$, the second engagement portion $24a$, the one second mounting portion $24b$, and the second land portion 4 indicated by the solid line.

In FIG. 13, the other first mounting portion $14c$ can be electrically connected to the first land portion 3 indicated by the dotted line, while the other second mounting portion $24c$ can be electrically connected to the second land portion 4 indicated by the dotted line. In this case, an electrical path is formed to mutually connect the first land portion 3 indicated by the dotted line, the other first mounting portion $14c$, the first engagement portion $14a$, the second engagement portion $24a$, the other second mounting portion $24c$, and the second land portion 4 indicated by the dotted line.

Thus, an appropriate electrical path can be formed by connecting any one of the one first mounting portion $14b$ and the other first mounting portion $14c$ to any one of the one second mounting portion $24b$ and the other second mounting portion $24c$. This can increase the degree of freedom in wiring design (i.e., disposition of the first land portions 3 and the second land portions 4) of the first circuit board 1 and the second circuit board 2.

In the case in which the first land portion 3 and the second land portion 4 are positioned at the first overlapping region $L_{2-2}$ that has an overlapping area smaller than that of the second overlapping region $L_{1-2}$, the electrical path from the first land portion 3 to the second land portion 4 can be shortened, which leads to a reduction in electrical loss. This is especially preferable in the case of signals being transmitted in a high-frequency band, such as megahertz or gigahertz band, because the electrical loss becomes significant as the electrical path becomes longer.

Since the area of the second overlapping region $L_{1-2}$ is larger than that of the first overlapping region $L_{2-2}$, a greater electrostatic capacity can be generated between the first mounting portions $14b$ and $14c$ of the first connector 10 and the second mounting portions $24b$ and $24c$ of the second connector 20.

One embodiment of the present disclosure has been described by way of example. The present disclosure, however, is not limited to the above embodiment but may be subjected to alterations and modifications within the scope of the disclosure.

The present disclosure and the embodiment can be summarized as below.

The electric connector set according to an aspect of the present disclosure is the electric connector set 30 that includes the first connector 10 configured to be mounted onto the first circuit board 1 and the second connector 20 configured to be mounted onto the second circuit board 2 and to engage the first connector 10 so as to be insertable into and withdrawable from the first connector 10 in an insertion-withdrawal direction. The first connector 10 includes the first connection terminal 14 having the first mounting portions $14b$ and $14c$ to be mounted onto the first land portions 3 disposed on the first circuit board 1 and the first insulating member 12 that holds the first connection terminal 14. The second connector 20 includes the second connection terminal 24 having the second mounting portions $24b$ and $24c$ to be mounted onto the second land portions 4 disposed on the second circuit board 2 and the second insulating member 22 that holds the second connection terminal 24. In an engagement state of the electric connector set 30, the first mounting portions $14b$ and $14c$ oppose the second mounting portion $24b$ and $24c$ and overlap the second mounting portion $24b$ and $24c$, respectively, as viewed in the insertion-withdrawal direction.

According to the above-described configuration, in the engagement state of the electric connector set 30, the first mounting portions $14b$ and $14c$ oppose and overlap the second mounting portions $24b$ and $24c$ as viewed in the insertion-withdrawal direction. Electrostatic capacity is thereby generated between the first mounting portions $14b$ and $14c$ and the second mounting portions $24b$ and $24c$. The electrostatic capacity can serve like a capacitor for adjusting characteristic impedance. Accordingly, the electric connector set 30 itself has an impedance adjustment function for adjusting the characteristic impedance.

In the electric connector set 30 according to the embodiment, the first mounting portions $14b$ and $14c$ are the one first mounting portion $14b$ and the other first mounting portion $14c$ that extends in a direction opposite to a direction in which the one first mounting portion $14b$ extends with respect to the first insulating member 12. In addition, the second mounting portions $24b$ and $24c$ are the one second mounting portion $24b$ and the other second mounting portion 24c that extends in a direction opposite to a direction in which the one second mounting portion 24b extends with respect to the second insulating member 22.

According to the above embodiment, the degree of freedom in wiring design (i.e., disposition of the first land portions 3 and the second land portions 4) of the first circuit board 1 and the second circuit board 2 can be increased.

In the electric connector set 30 according to the embodiment, the extension lengths $L_1$ and $L_2$ of the first mounting portions 14b and 14c and the second mounting portions 24b and 24c are greater than the contact distance $L_0$ between two contact portions 14d and 24d that are formed when the first connection terminal 14 and the second connection terminal 24 are brought into electrical contact with each other.

According to the above embodiment, the electrostatic capacity can be increased even though the sizes of the first connection terminal 14 and the second connection terminal 24 are limited.

In the electric connector set 30 according to the embodiment, the first insulating member 12 has the first bottom wall 12a, the one first longitudinal wall 12b, the other first longitudinal wall 12c, the two first lateral walls 12f, and the first recess 12h. In addition, the second insulating member 22 has the second bottom wall 22a, the one second longitudinal wall 22b, the other second longitudinal wall 22c, the two second lateral walls 22f, the second protrusion 22d configured to engage the first recess 12h, and the second recess 28 configured to engage the one first longitudinal wall 12b, the other first longitudinal wall 12c, and the two first lateral walls 12f.

According to the above embodiment, the first insulating member 12 and the second insulating member 22 engage each other entirely and thereby stably, which can prevent undesirable disengagement.

In the electric connector set 30 according to the embodiment, the first insulating portion 5 of the first circuit board 1 and the second insulating portion 6 of the second circuit board 2 have respective dielectric constants smaller than any of dielectric constants of the first insulating member 12 and the second insulating member 22.

According to the above embodiment, the dielectric loss in high-frequency bands, such as megahertz band or gigahertz band, can be reduced. In addition, the electrostatic capacity generated between the first mounting portions 14b and 14c of the first connector and the second mounting portions 24b and 24c of the second connector 20 can be increased, which will be described later.

In the electric connector set 30 according to the embodiment, the first overlapping region $L_{2\text{-}2}$ and the second overlapping region $L_{1\text{-}2}$ are formed between the first mounting portions 14b and 14c and the second mounting portions 24b and 24c, and the first mounting portions 14b and 14c overlap the second mounting portions 24b and 24c in the first overlapping region $L_{2\text{-}2}$ and in the second overlapping region $L_{1\text{-}2}$, respectively. In addition, the first land portion 3 and the second land portion 4 are positioned at the first overlapping region $L_{2\text{-}2}$, and the area of the first overlapping region $L_{2\text{-}2}$ is smaller than the area of the second overlapping region $L_{1\text{-}2}$.

According to the above embodiment, in the case in which the first land portion 3 and the second land portion 4 are positioned at the first overlapping region $L_{2\text{-}2}$ that has the overlapping area smaller than that of the second overlapping region $L_{1\text{-}2}$, the electrical path from the first land portion 3 to the second land portion 4 can be shortened, which leads to a reduction in electrical loss. This is especially preferable in the case of signals transmitted in a high-frequency band, such as megahertz or gigahertz band, because the electrical loss becomes significant as the electrical path is longer. Moreover, the area of the second overlapping region $L_{1\text{-}2}$ is larger than that of the first overlapping region $L_{2\text{-}2}$. Accordingly, a greater electrostatic capacity can be generated between the first mounting portions 14b and 14c of the first connector 10 and the second mounting portions 24b and 24c of the second connector 20.

According to another aspect of the present disclosure, the mounting structure of the electric connector set 1 includes a first circuit board having a first land portion, a second circuit board having a second land portion, and an electric connector set. The electric connector set includes a first connector configured to be mounted on the first circuit board and a second connector configured to be mounted on the second circuit board and to engage the first connector so as to be insertable into and withdrawable from the first connector in an insertion-withdrawal direction. The first connector includes a first connection terminal and a first insulating member that holds the first connection terminal. The second connector includes a second connection terminal and a second insulating member that holds the second connection terminal. The first connection terminal has a first mounting portion, and the first mounting portion is mounted on the first land portion. The second connection terminal has a second mounting portion, and the second mounting portion is mounted on the second land portion. In addition, in an engagement state of the electric connector set, the first mounting portion is disposed so as to overlap the second mounting portion as viewed in the insertion-withdrawal direction.

According to the above-described configuration, in the engagement state of the electric connector set 30, the first mounting portions 14b and 14c oppose and overlap the second mounting portions 24b and 24c as viewed in the insertion-withdrawal direction. Electrostatic capacity is thereby generated between the first mounting portions 14b and 14c and the second mounting portions 24b and 24c. The electrostatic capacity can serve like a capacitor for adjusting characteristic impedance. Accordingly, the mounting structure of the electric connector set 30 itself has an impedance adjustment function for adjusting the characteristic impedance.

What is claimed is:
1. An electric connector set comprising:
a first connector configured to mount onto a first circuit board, the first connector including a first connection terminal having a first mounting portion configured to mount onto a first land portion disposed on the first circuit board, and a first insulating member configured to hold the first connection terminal; and
a second connector configured to mount onto a second circuit board and to engage the first connector so as to be insertable into and withdrawable from the first connector in an insertion-withdrawal direction, the second connector including a second connection terminal having a second mounting portion configured to mount onto a second land portion disposed on the second circuit board, and a second insulating member configured to hold the second connection terminal, and
wherein in an engagement state of the electric connector set, the first mounting portion opposes the second mounting portion and overlaps the second mounting portion as viewed in the insertion-withdrawal direction.

2. The electric connector set according to claim 1, wherein the first mounting portion includes
one first mounting part, and
another first mounting part that extends in a direction opposite to a direction in which the one first mounting part extends with respect to the first insulating member, and
the second mounting portion includes
one second mounting part, and
another second mounting part that extends in a direction opposite to a direction in which the one second mounting part extends with respect to the second insulating member.

3. The electric connector set according to claim 1, wherein an extension length of the first mounting portion and an extension length of the second mounting portion are greater than a contact distance between two contact portions that are formed when the first connection terminal and the second connection terminal are brought into electrical contact with each other.

4. The electric connector set according to claim 1, wherein the first insulating member has a first bottom wall, one first longitudinal wall, an other first longitudinal wall, two first lateral walls, and a first recess, and
the second insulating member has a second bottom wall, one second longitudinal wall, an other second longitudinal wall, two second lateral walls, a second protrusion configured to engage the first recess, and a second recess configured to engage the one first longitudinal wall, the other first longitudinal wall, and the two first lateral walls.

5. The electric connector set according to claim 1, wherein a first insulating portion of the first circuit board and a second insulating portion of the second circuit board have respective dielectric constants smaller than any of dielectric constants of the first insulating member and the second insulating member.

6. The electric connector set according to claim 1, wherein a first overlapping region and a second overlapping region are formed between the first mounting portion and the second mounting portion, and the first mounting portion overlaps the second mounting portion in the first overlapping region and in the second overlapping region,
the first land portion and the second land portion are positioned at the first overlapping region, and
an area of the first overlapping region is smaller than an area of the second overlapping region.

7. The electric connector set according to claim 2, wherein an extension length of the first mounting portion and an extension length of the second mounting portion are greater than a contact distance between two contact portions that are formed when the first connection terminal and the second connection terminal are brought into electrical contact with each other.

8. The electric connector set according to claim 2, wherein the first insulating member has a first bottom wall, one first longitudinal wall, an other first longitudinal wall, two first lateral walls, and a first recess, and
the second insulating member has a second bottom wall, one second longitudinal wall, an other second longitudinal wall, two second lateral walls, a second protrusion configured to engage the first recess, and a second recess configured to engage the one first longitudinal wall, the other first longitudinal wall, and the two first lateral walls.

9. The electric connector set according to claim 3, wherein the first insulating member has a first bottom wall, one first longitudinal wall, an other first longitudinal wall, two first lateral walls, and a first recess, and
the second insulating member has a second bottom wall, one second longitudinal wall, an other second longitudinal wall, two second lateral walls, a second protrusion configured to engage the first recess, and a second recess configured to engage the one first longitudinal wall, the other first longitudinal wall, and the two first lateral walls.

10. The electric connector set according to claim 2, wherein
the first insulating member has a first bottom wall, one first longitudinal wall, an other first longitudinal wall, two first lateral walls, and a first recess, and
the second insulating member has a second bottom wall, one second longitudinal wall, an other second longitudinal wall, two second lateral walls, a second protrusion configured to engage the first recess, and a second recess configured to engage the one first longitudinal wall, the other first longitudinal wall, and the two first lateral walls.

11. The electric connector set according to claim 2, wherein
a first insulating portion of the first circuit board and a second insulating portion of the second circuit board have respective dielectric constants smaller than any of dielectric constants of the first insulating member and the second insulating member.

12. The electric connector set according to claim 8, wherein
a first insulating portion of the first circuit board and a second insulating portion of the second circuit board have respective dielectric constants smaller than any of dielectric constants of the first insulating member and the second insulating member.

13. The electric connector set according to claim 2, wherein
a first overlapping region and a second overlapping region are formed between the first mounting portion and the second mounting portion, and the first mounting portion overlaps the second mounting portion in the first overlapping region and in the second overlapping region,
the first land portion and the second land portion are positioned at the first overlapping region, and
an area of the first overlapping region is smaller than an area of the second overlapping region.

14. The electric connector set according to claim 3, wherein
a first overlapping region and a second overlapping region are formed between the first mounting portion and the second mounting portion, and the first mounting portion overlaps the second mounting portion in the first overlapping region and in the second overlapping region,
the first land portion and the second land portion are positioned at the first overlapping region, and
an area of the first overlapping region is smaller than an area of the second overlapping region.

15. The electric connector set according to claim 4, wherein
a first overlapping region and a second overlapping region are formed between the first mounting portion and the second mounting portion, and the first mounting portion overlaps the second mounting portion in the first overlapping region and in the second overlapping region, the first land portion and the second land portion are positioned at the first overlapping region, and an area of the first overlapping region is smaller than an area of the second overlapping region.

16. The electric connector set according to claim 5, wherein a first overlapping region and a second overlapping region are formed between the first mounting portion and the second mounting portion, and the first mounting portion overlaps the second mounting portion in the first overlapping region and in the second overlapping region, the first land portion and the second land portion are positioned at the first overlapping region, and an area of the first overlapping region is smaller than an area of the second overlapping region.

17. A mounting structure of an electric connector set, the mounting structure comprising:

a first circuit board having a first land portion;

a second circuit board having a second land portion; and an electric connector set including a first connector configured to mount on the first circuit board, the first connector including a first connection terminal and a first insulating member configured to hold the first connection terminal, and the first connection terminal having a first mounting portion that is mounted on the first land portion, and a second connector configured to mount on the second circuit board and to engage the first connector so as to be insertable into and withdrawable from the first connector in an insertion-withdrawal direction, the second connector including a second connection terminal and a second insulating member configured to hold the second connection terminal, and the second connection terminal having a second mounting portion that is mounted on the second land portion, and wherein in an engagement state of the electric connector set, the first mounting portion is disposed so as to overlap the second mounting portion as viewed in the insertion-withdrawal direction.

18. The electric connector set according to claim 1, wherein the second mounting portion is electrically conductive.

19. The mounting structure according to claim 17, wherein the second mounting portion is electrically conductive.

20. The electric connector set according to claim 18, wherein the electrically conductive second mounting portion is made of phosphor bronze.

* * * * *